United States Patent
Derrickson et al.

(10) Patent No.: US 12,211,929 B1
(45) Date of Patent: Jan. 28, 2025

(54) HETEROJUNCTION BIPOLAR TRANSISTORS WITH TERMINALS HAVING A NON-PLANAR ARRANGEMENT

(71) Applicant: GlobalFoundries U.S. Inc., Malta, NY (US)

(72) Inventors: Alexander Derrickson, Saratoga Springs, NY (US); Anupam Dutta, Bangalore (IN); John Pekarik, Underhill, VT (US); Vibhor Jain, Essex Junction, VT (US); V V S S Satyasuresh Choppalli, Bangalore (IN); Rui Tze Toh, Singapore (SG); Oscar Restrepo, Halfmoon, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/663,523

(22) Filed: May 14, 2024

(51) Int. Cl.
*H01L 29/737* (2006.01)
*H01L 29/08* (2006.01)
*H01L 29/10* (2006.01)
*H01L 29/165* (2006.01)
*H01L 29/417* (2006.01)
*H01L 29/423* (2006.01)
*H01L 29/66* (2006.01)

(52) U.S. Cl.
CPC ........ *H01L 29/737* (2013.01); *H01L 29/0808* (2013.01); *H01L 29/0821* (2013.01); *H01L 29/1008* (2013.01); *H01L 29/165* (2013.01); *H01L 29/41708* (2013.01); *H01L 29/42304* (2013.01); *H01L 29/66242* (2013.01)

(58) Field of Classification Search
CPC ............. H01L 29/737; H01L 29/66242; H01L 29/165; H01L 29/0821; H01L 29/41708; H01L 29/0808; H01L 29/1008
USPC .......................... 257/197; 438/235, 309, 312
See application file for complete search history.

(56) References Cited

U.S. PATENT DOCUMENTS

| | | | |
|---|---|---|---|
| 6,337,494 B1 * | 1/2002 | Ryum | H01L 29/732 257/E29.183 |
| 7,173,320 B1 | 2/2007 | Rahim | |
| 7,569,872 B1 * | 8/2009 | Rajavel | H01L 29/7371 257/197 |
| 8,324,713 B2 | 12/2012 | Chen et al. | |
| 2005/0101096 A1 * | 5/2005 | Li | H01L 29/737 438/316 |

(Continued)

*Primary Examiner* — Didarul A Mazumder
(74) *Attorney, Agent, or Firm* — Thompson Hine LLP; Francois Pagette (57) ABSTRACT

Structures for a heterojunction bipolar transistor and methods of forming a structure for a heterojunction bipolar transistor. The structure comprises an intrinsic base including a first semiconductor layer, a collector including a second semiconductor layer, and an emitter including a third semiconductor layer. The first semiconductor layer, which comprises silicon-germanium, includes a first portion and a second portion adjacent to the first portion. The second semiconductor layer includes a portion on the first portion of the first semiconductor layer, and the third semiconductor layer includes a portion on the second portion of the first semiconductor layer. The structure further comprises a dielectric spacer laterally between the portion of the second semiconductor layer and the portion of the third semiconductor layer.

20 Claims, 5 Drawing Sheets

(56) References Cited

U.S. PATENT DOCUMENTS

| | | | |
|---|---|---|---|
| 2006/0043529 A1* | 3/2006 | Chidambarrao | H01L 29/7378 |
| | | | 257/E29.102 |
| 2013/0001647 A1* | 1/2013 | Adler | H01L 21/84 |
| | | | 257/E29.189 |
| 2014/0264457 A1* | 9/2014 | Preisler | H01L 29/0821 |
| | | | 438/318 |
| 2017/0373175 A1* | 12/2017 | Gu | H01L 23/48 |
| 2019/0157417 A1* | 5/2019 | Balakrishnan | H01L 29/1004 |
| 2021/0098612 A1* | 4/2021 | Pekarik | H01L 29/42304 |

* cited by examiner

HETEROJUNCTION BIPOLAR TRANSISTORS WITH TERMINALS HAVING A NON-PLANAR ARRANGEMENT

BACKGROUND

The disclosure relates generally to semiconductor devices and integrated circuit fabrication and, in particular, to structures for a heterojunction bipolar transistor and methods of forming a structure for a heterojunction bipolar transistor.

A bipolar junction transistor is a three-terminal electronic device that includes an emitter, a collector, and an intrinsic base between the emitter and the collector. The intrinsic base defines a p-n junction with the emitter and another p-n junction with the collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. In operation, the base-emitter p-n junction is forward biased, the base-collector p-n junction is reverse biased, and the collector-emitter current may be controlled with a base-emitter voltage.

A heterojunction bipolar transistor is a variant of a bipolar junction transistor in which the semiconductor materials have different energy bandgaps. For example, the collector and emitter of a heterojunction bipolar transistor may be constituted by silicon, and the intrinsic base of a heterojunction bipolar transistor may be constituted by silicon-germanium, which is characterized by a narrower band gap than silicon. Heterojunction bipolar transistors may exhibit improvements in high frequency performance because of the existence of heterojunctions between the dissimilar semiconductor materials.

Improved structures for a heterojunction bipolar transistor and methods of forming a structure for a heterojunction bipolar transistor are needed.

SUMMARY

In an embodiment of the invention, a structure for a heterojunction bipolar junction transistor is provided. The structure comprises an intrinsic base including a first semiconductor layer, a collector including a second semiconductor layer, and an emitter including a third semiconductor layer. The first semiconductor layer, which comprises silicon-germanium, includes a first portion and a second portion adjacent to the first portion. The second semiconductor layer includes a portion on the first portion of the first semiconductor layer, and the third semiconductor layer includes a portion on the second portion of the first semiconductor layer. The structure further comprises a dielectric spacer laterally between the portion of the second semiconductor layer and the portion of the third semiconductor layer.

In an embodiment of the invention, a method of forming a structure for a heterojunction bipolar transistor is provided. The method comprises forming an intrinsic base including a first semiconductor layer, forming a collector including a second semiconductor layer, and forming an emitter including a third semiconductor layer. The first semiconductor layer, which comprises silicon-germanium, includes a first portion and a second portion adjacent to the first portion. The method further comprises forming a dielectric spacer. The third semiconductor layer includes a portion on the second portion of the first semiconductor layer, and the dielectric spacer is laterally between the portion of the second semiconductor layer and the portion of the third semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
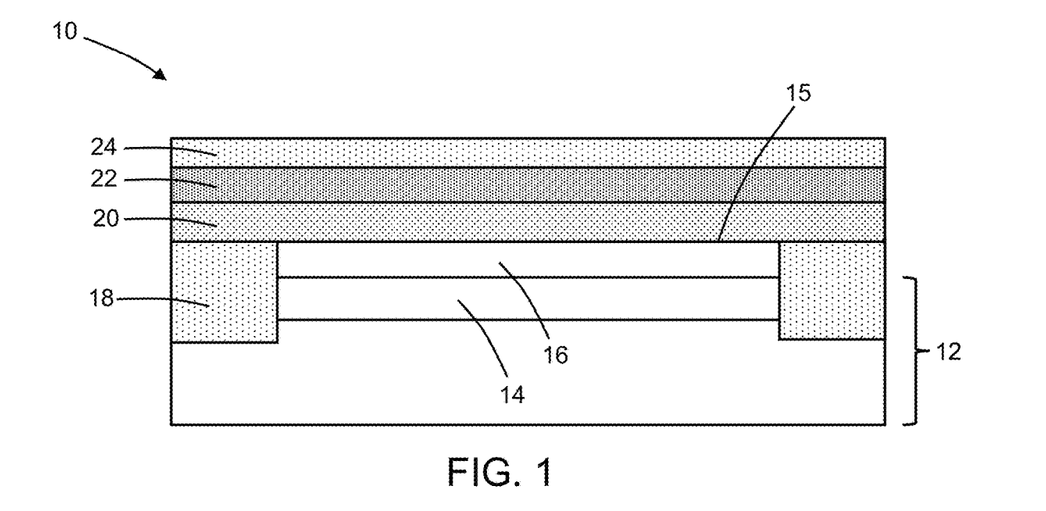
FIG. 1 is a cross-sectional view of a structure at an initial fabrication stage of a processing method in accordance with embodiments of the invention.

With reference to FIG. 1 and in accordance with embodiments of the invention, a structure 10 for a heterojunction bipolar transistor may be formed using a semiconductor substrate 12. The semiconductor substrate 12 may be comprised of a semiconductor material, such as single-crystal silicon. In an embodiment, the semiconductor substrate 12 may be lightly doped to have p-type conductivity.

A doped semiconductor region 14 may be formed in the semiconductor substrate 12. In an embodiment, the doped semiconductor region 14 may be doped (e.g., heavily doped) with a concentration of a p-type dopant (e.g., boron) to provide p-type conductivity. The doped semiconductor region 14 may be formed by implanting ions, such as ions including the p-type dopant, with an implantation mask having an opening defining the intended location for the doped semiconductor region 14 in the semiconductor substrate 12. The implantation conditions, such as ion species, dose, and kinetic energy, may be selected to tune the electrical and physical characteristics of the doped semiconductor region 14. In an alternative embodiment, the doped semiconductor region 14 may be doped with a concentration of an n-type dopant (e.g., arsenic or phosphorus) to provide n-type conductivity. In an alternative embodiment, the doped semiconductor region 14 may be an epitaxial layer that is grown on the semiconductor substrate 12.

A semiconductor layer 16 may be formed on a top surface of the semiconductor substrate 12. In an embodiment, the semiconductor layer 16 may directly contact the top surface of the semiconductor substrate 12. The semiconductor layer 16, which may be formed as an epitaxial layer using an epitaxial growth process, may be constituted by a single-crystal semiconductor material, such as single-crystal silicon-germanium. As used herein, a single-crystal semiconductor material may be characterized by a continuous crystal lattice and the absence of grain boundaries. The crystal structure of the single-crystal semiconductor material of the semiconductor substrate 12 may serve as a crystalline template for the crystal structure of the single-crystal semiconductor material of the semiconductor layer 16 during epitaxial growth. In an embodiment, the semiconductor layer 16 may be comprised of silicon-germanium including silicon and germanium with the silicon content ranging from 95 atomic percent to 50 atomic percent and the germanium content ranging from 5 atomic percent to 50 atomic percent. In an embodiment, the germanium content of the semiconductor layer 16 may be graded over its volume. In an embodiment, the semiconductor layer 16 may be doped with a concentration of a p-type dopant (e.g., boron) to provide p-type conductivity. In an alternative embodiment, the semiconductor layer 16 may be doped with a concentration of an n-type dopant (e.g., arsenic or phosphorus) to provide n-type conductivity.

Shallow trench isolation regions 18 are formed in the semiconductor substrate 12 and semiconductor layer 16. The shallow trench isolation regions 18 may be formed by patterning shallow trenches with lithography and etching processes, depositing a dielectric material, such as silicon dioxide, to fill the shallow trenches, and planarizing and/or recessing the dielectric material. The shallow trench isolation regions 18, which may fully penetrate through the semiconductor layer 16 and the doped semiconductor region 14, may be substantially coplanar with a top surface 15 of the semiconductor layer 16. The shallow trench isolation regions 18 may laterally surround the entirety of the semiconductor layer 16 and the entirety of the doped semiconductor region 14.

The doped semiconductor region 14 may constitute an extrinsic base of the heterojunction bipolar transistor embodied in the structure 10. The semiconductor layer 16 may constitute an intrinsic base of the heterojunction bipolar transistor embodied in the structure 10. The doped semiconductor region 14 and the semiconductor layer 16 are laterally bounded by the shallow trench isolation regions 18.

A semiconductor layer 20, a semiconductor layer 22, and a dielectric layer 24 may be sequentially formed on the top surface 15 of the semiconductor layer 16 after forming the shallow trench isolation regions 18. The semiconductor layer 20 is disposed adjacent to the semiconductor layer 16, the semiconductor layer 22 is disposed adjacent to the semiconductor layer 20, and the semiconductor layer 20 is disposed between the semiconductor layer 22 and the semiconductor layer 16. In an embodiment, the semiconductor layer 20 may directly contact the top surface of the semiconductor layer 16, and the semiconductor layer 22 may directly contact the top surface of the semiconductor layer 20. The dielectric layer 24, which may be comprised of silicon nitride, provides a cap over the semiconductor layer 22.

The semiconductor layers 20, 22 may be formed as epitaxial layers using an epitaxial growth process, and the semiconductor layers 20, 22 may contain single-crystal semiconductor material, such as single-crystal silicon. The crystal structure of the single-crystal semiconductor material of the semiconductor layer 16 may serve as a crystalline template for the crystal structure of the single-crystal semiconductor material of the semiconductor layers 20, 22 during epitaxial growth. In an embodiment, the semiconductor layers 20, 22 may be doped with a concentration of a dopant, such as an n-type dopant (e.g., arsenic or phosphorus), to provide n-type conductivity. The semiconductor layer 22 may contain a higher concentration of the n-type dopant than the semiconductor layer 20. In an alternative embodiment, the semiconductor layers 20, 22 may be doped with a concentration of a p-type dopant (e.g., boron) to provide p-type conductivity with the semiconductor layer 22 containing a higher concentration of the p-type dopant than the semiconductor layer 20.

Figure 2:
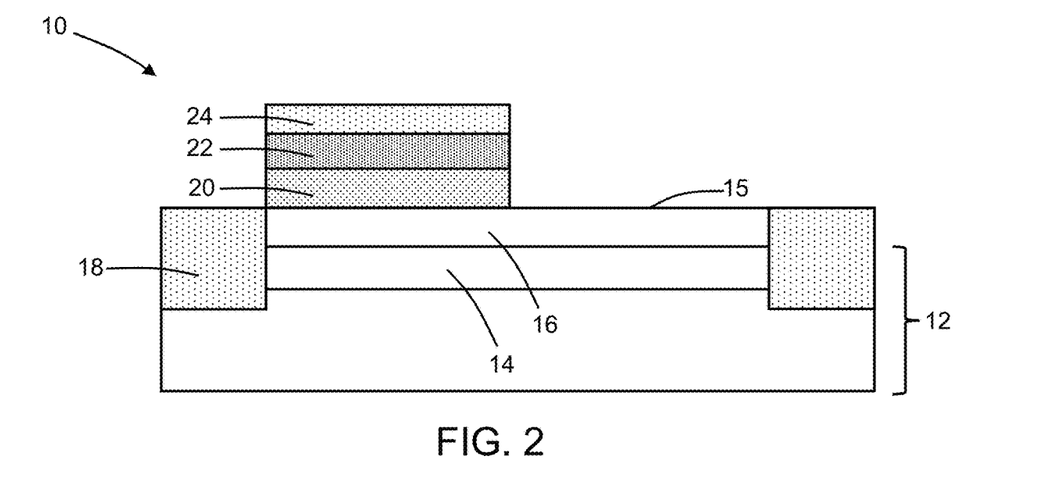
FIG. 2 is a cross-sectional view of the structure at a fabrication stage subsequent to FIG. 1.

With reference to FIG. 2 in which like reference numerals refer to like features in FIG. 1 and at a subsequent fabrication stage, the semiconductor layers 20, 22 and dielectric layer 24 may be patterned using lithography and etching processes. The dielectric layer 24 may serve as a hardmask when patterning the semiconductor layers 20, 22. The lithography process may entail applying a layer of photoresist by a spin coating process, pre-baking, exposing the photoresist to light projected through a photomask, baking after exposure, and developing with a chemical developer to form a photoresist feature covering a portion of the dielectric layer 24. The etching process may be an anisotropic etching process, such as a reactive ion etching process, and the photoresist may be stripped by, for example, plasma ashing after patterning the semiconductor layers 20, 22 and dielectric layer 24.

The patterned semiconductor layers 20, 22 are disposed in a layer stack that overlaps with a portion of the semiconductor layer 16. The patterned semiconductor layer 20 is vertically disposed between the patterned semiconductor layer 22 and the overlapped portion of the semiconductor layer 16. In an embodiment, the semiconductor layers 20, 22 may have a non-overlapping relationship with the shallow trench isolation regions 18. In an embodiment, the semiconductor layers 20, 22 may constitute a collector of the heterojunction bipolar transistor embodied in the structure 10.

Figure 3:
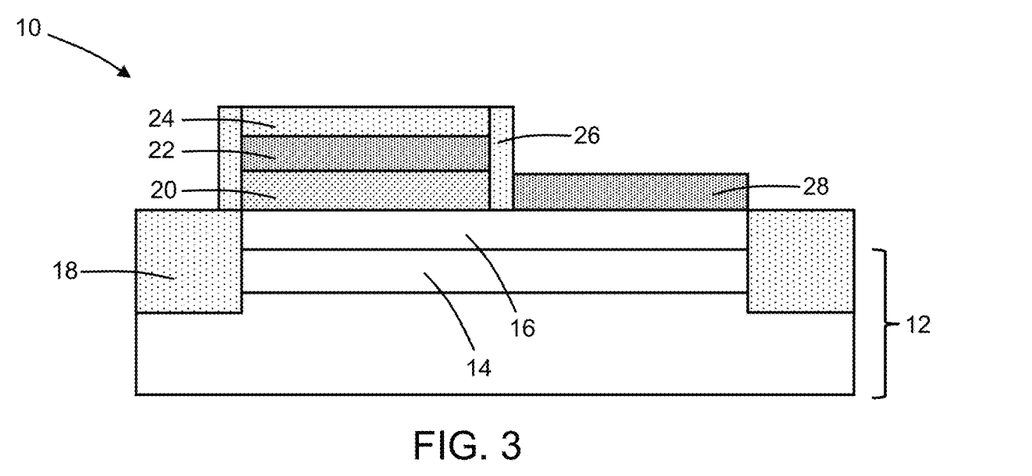
FIG. 3 is a cross-sectional view of the structure at a fabrication stage subsequent to FIG. 2.

With reference to FIG. 3 in which like reference numerals refer to like features in FIG. 2 and at a subsequent fabrication stage, dielectric spacers 26 may be formed by conformally depositing a dielectric material, such as silicon nitride, and anisotropically etching the deposited dielectric material. The dielectric spacers 26 are disposed at the opposite sides of the patterned semiconductor layers 20, 22 and dielectric layer 24.

A semiconductor layer 28 may be formed on the semiconductor layer 16 after forming the dielectric spacers 26. In an embodiment, the semiconductor layer 28 may directly contact the top surface 15 of the semiconductor layer 16. The semiconductor layer 28 may be formed as an epitaxial layer using an epitaxial growth process, and the semiconductor layer 28 may contain single-crystal semiconductor material, such as single-crystal silicon. The crystal structure of the single-crystal semiconductor material of the semiconductor layer 16 may serve as a crystalline template for the crystal structure of the single-crystal semiconductor material of the semiconductor layer 28 during epitaxial growth. In an embodiment, the epitaxial growth process may be selective in that the semiconductor material does not deposit on the dielectric material of the shallow trench isolation regions 18. The semiconductor layer 28 may be doped to have the same conductivity type as the semiconductor layers 20, 22. In an embodiment, the semiconductor layer 28 may be doped with a concentration of a dopant, such as an n-type dopant (e.g., arsenic or phosphorus), to provide n-type conductivity. In an alternative embodiment, the semiconductor layer 28 may be doped with a concentration of a p-type dopant (e.g., boron) to provide n-type conductivity.

The semiconductor layer 28 overlaps with a portion of the semiconductor layer 16 adjacent to the portion of the semiconductor layer 16 overlapped by the semiconductor layers 20, 22. In an embodiment, the semiconductor layer 28 may have a non-overlapping relationship with the shallow trench isolation regions 18. In an embodiment, the semiconductor layer 28 may constitute an emitter of the heterojunction bipolar transistor embodied in the structure 10. One of the dielectric spacers 26 is disposed between the stacked semiconductor layers 20, 22 and the semiconductor layer 28 and supplies electrical isolation between the emitter and collector.

Figure 4:
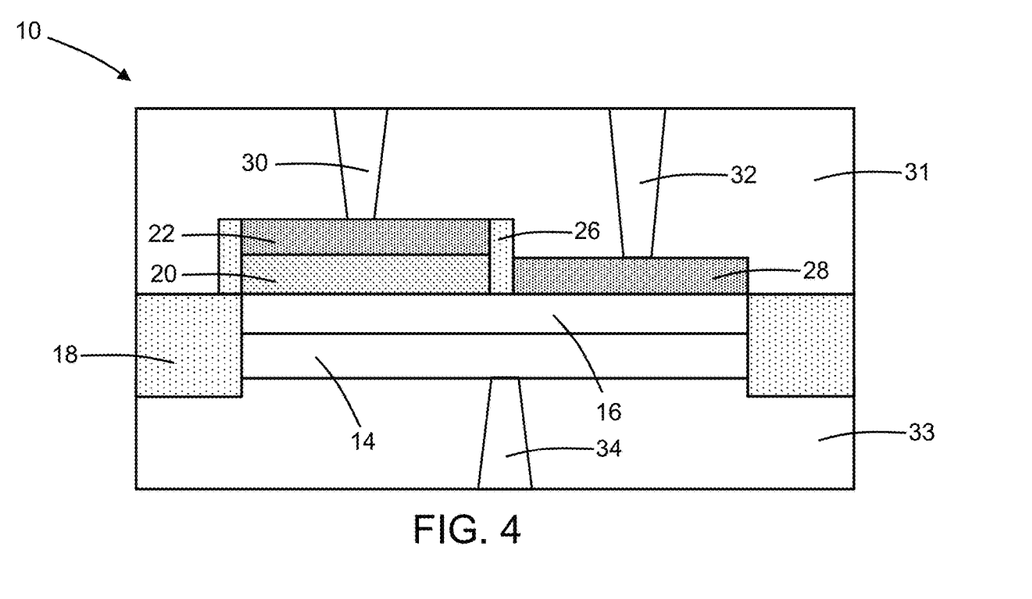
FIG. 4 is a cross-sectional view of the structure at a fabrication stage subsequent to FIG. 3.

With reference to FIG. 4 in which like reference numerals refer to like features in FIG. 3 and at a subsequent fabrication stage, a contact 30 is formed in a dielectric layer 31 that is physically and electrically coupled to the semiconductor layer 22 and a contact 32 is formed in the dielectric layer 31 that is physically and electrically coupled to the semiconductor layer 28. The dielectric layer 24 may be removed before forming the contact 30. In an embodiment, the semiconductor layer 22 and the semiconductor layer 28 may be silicided before forming the contacts 30, 32.

The semiconductor substrate 12 may be thinned from its back side by grinding, etching, and/or chemical mechanical polishing. In an embodiment, the thinned semiconductor substrate 12 may include the doped semiconductor region 14. A backside contact 34 may be formed in one or more dielectric layers 33 that is physically and electrically coupled to the doped semiconductor region 14.

In an embodiment, a back-end-of-line stack may be formed with metal features that are coupled to the contacts 30, 32 and the metal features of structure 10 may be wafer bonded to metal features of a back-end-of-line stack on a different chip, such as a Complementary Metal-Oxide-Semiconductor (CMOS) chip.

The structure 10 has a U-shaped profile in which the collector, the emitter, and the intrinsic base have a non-planar arrangement. The properties of the collector of the heterojunction bipolar transistor embodied in the structure 10 may be optimized by adjusting the properties of the semiconductor layer 20 and the properties of the semiconductor layer 22. Parasitic capacitances of the heterojunction bipolar transistor embodied in the structure 10 can be minimized by optimizing the electrical isolation provided by the dielectric spacers 26, such as by adjusting parameters (e.g., dielectric material and thickness) of the dielectric spacers 26. The base resistance, the emitter resistance, and the collector resistance may be reduced by the simplified contact scheme that includes a backside contact 34 to the intrinsic base of the heterojunction bipolar transistor embodied in the structure 10. In particular, the backside contact 34 is coupled by the doped semiconductor region 14 representing the extrinsic base to the semiconductor layer 16 representing the intrinsic base.

Figure 5:
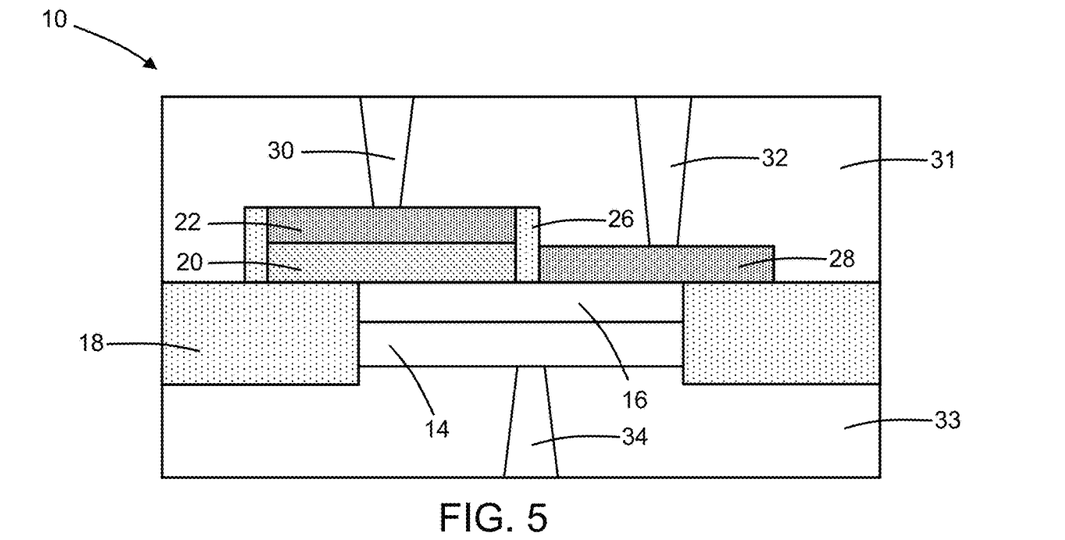
FIG. 5 is a cross-sectional view of a structure in accordance with alternative embodiments of the invention.

With reference to FIG. 5 and in accordance with alternative embodiments, the structure 10 may be modified such that the semiconductor layers 20, 22 have an overlapping relationship with the adjacent shallow trench isolation region 18 and the semiconductor layer 28 has an overlapping relationship with the adjacent shallow trench isolation region 18. More specifically, the semiconductor layers 20, 22 have stacked portions that overlap with the adjacent shallow trench isolation region 18 and other stacked portions that overlap with the semiconductor layer 16, and the semiconductor layer 28 has a portion that overlaps with the adjacent shallow trench isolation region 18 and another portion that overlaps with the semiconductor layer 16. The concomitant reduction in the width of the semiconductor layer 16 resulting from the modification to the shallow trench isolation regions 18 may reduce carrier scattering during operation of the heterojunction bipolar transistor embodied in the structure 10.

Figure 6:
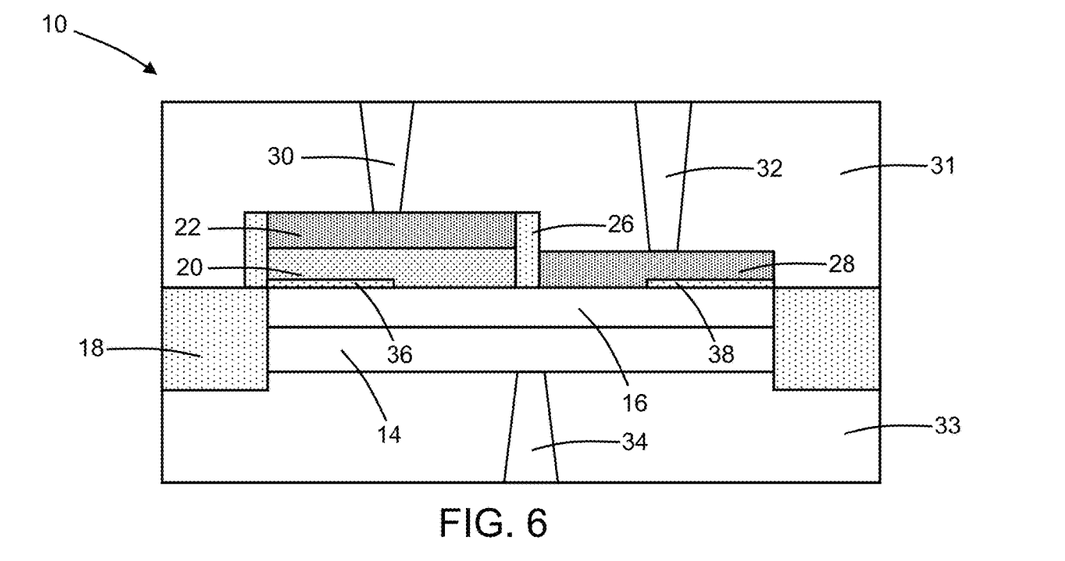
FIG. 6 is a cross-sectional view of a structure in accordance with alternative embodiments of the invention.

With reference to FIG. 6 and in accordance with alternative embodiments, the structure 10 may be modified to add a dielectric layer 36 on the top surface 15 of the semiconductor layer 16 before the semiconductor layers 20, 22 are formed, and modified to add a dielectric layer 38 on the top surface 15 of the semiconductor layer 16 before the semiconductor layer 28 is formed. The semiconductor layers 20, 22 have an overlapping relationship with the dielectric layer 36 and the semiconductor layer 28 has an overlapping relationship with the dielectric layer 38. More specifically, the semiconductor layers 20, 22 have stacked portions that overlap with the dielectric layer 36 and other stacked portions that overlap with the semiconductor layer 16, and the semiconductor layer 28 has a portion that overlaps with the dielectric layer 36 and another portion that overlaps with the semiconductor layer 16. In an embodiment, the dielectric layers 36, 38 may be comprised of a dielectric material, such as silicon nitride. The interface area between the semiconductor layer 20 and the semiconductor layer 16 may be reduced by the addition of the dielectric layer 36, and the interface area between the semiconductor layer 28 and the semiconductor layer 16 may be reduced by the addition of the dielectric layer 38.

Figure 7:
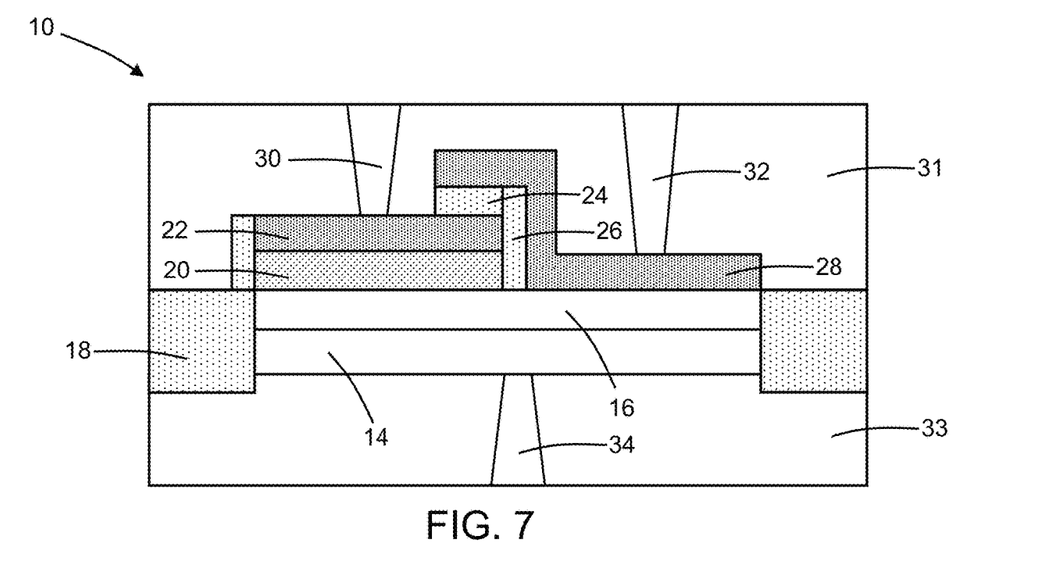
FIG. 7 is a cross-sectional view of a structure in accordance with alternative embodiments of the invention.

With reference to FIG. 7 and in accordance with alternative embodiments, the semiconductor layer 28 may overlap with the adjacent dielectric spacer 26 and a portion of the dielectric layer 24 adjacent to the dielectric spacer 26. In that regard, the semiconductor layer 28 may be deposited and then patterned by lithography and etching processes such that a portion of the dielectric layer 24 is covered and protected when the dielectric layer 24 is subsequently etched in preparation for forming the contact 30 to the semiconductor layer 22.

Figure 8:
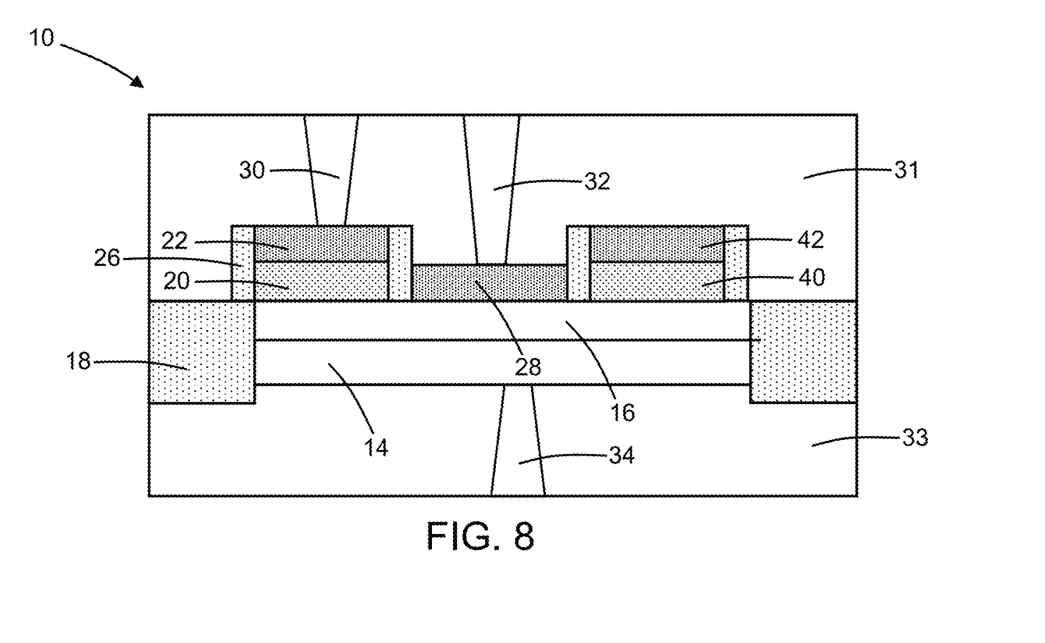
FIG. 8 is a cross-sectional view of a structure in accordance with alternative embodiments of the invention.

With reference to FIG. 8 and in accordance with alternative embodiments, semiconductor layers 40, 42 similar or identical to the semiconductor layers 20, 22 may be formed on the semiconductor layer 16 to provide a symmetrical structural arrangement for the heterojunction bipolar transistor embodied in the structure 10 that includes multiple collectors flanking the emitter. The semiconductor layer 28 is disposed in a lateral direction between the layer stack including the semiconductor layers 20, 22 and the layer stack including the semiconductor layers 40, 42. The semiconductor layer 40 is vertically disposed adjacent to the semiconductor layer 16, the semiconductor layer 42 is vertically disposed adjacent to the semiconductor layer 40, and the semiconductor layer 40 is vertically disposed between the semiconductor layer 42 and the semiconductor layer 16. In an embodiment, the semiconductor layer 40 may directly contact the top surface 15 of the semiconductor layer 16, and the semiconductor layer 42 may directly contact the top surface of the semiconductor layer 40.

The semiconductor layers 40, 42 may be formed as epitaxial layers using an epitaxial growth process, and the semiconductor layers 40, 42 may contain single-crystal semiconductor material, such as single-crystal silicon. The crystal structure of the single-crystal semiconductor material of the semiconductor layer 16 may serve as a crystalline template for the crystal structure of the single-crystal semiconductor material of the semiconductor layers 40, 42 during epitaxial growth. In an embodiment, the semiconductor layers 40, 42 may be doped with a concentration of a dopant, such as an n-type dopant (e.g., arsenic or phosphorus), to provide n-type conductivity. The semiconductor layer 42 may contain a higher concentration of the n-type dopant than the semiconductor layer 40. The semiconductor layers 40, 42 may be patterned using lithography and etching processes, and a contact 44 may be formed in the dielectric layer 31 that is coupled to the semiconductor layer 42. In an alternative embodiment, the semiconductor layers 40, 42 may be doped with a concentration of a p-type dopant (e.g., boron) to provide p-type conductivity.

One of the dielectric spacers 26 is laterally disposed between the stacked semiconductor layers 40, 42 and the semiconductor layer 28. The semiconductor layers 20, 22, the semiconductor layers 40, 42, and the semiconductor layer 28 may be doped to have the same conductivity type. The patterned semiconductor layers 40, 42 are disposed in a layer stack that overlaps with a portion of the semiconductor layer 16. In an embodiment, the semiconductor layers 40, 42 may have a non-overlapping relationship with the shallow trench isolation regions 18. The patterned semiconductor layer 40 is disposed between the patterned semiconductor layer 42 and the overlapped portion of the semiconductor layer 16.

In an alternative embodiment, the semiconductor layers 40, 42 may overlap in part with the semiconductor layer 16 and in part with the adjacent shallow trench isolation region 18, the semiconductor layers 20, 22 may also overlap in part with the semiconductor layer 16 and in part with the adjacent shallow trench isolation region 18, and the semiconductor layer 28 may have a non-overlapping relationship with the shallow trench isolation regions 18.

Figure 9:
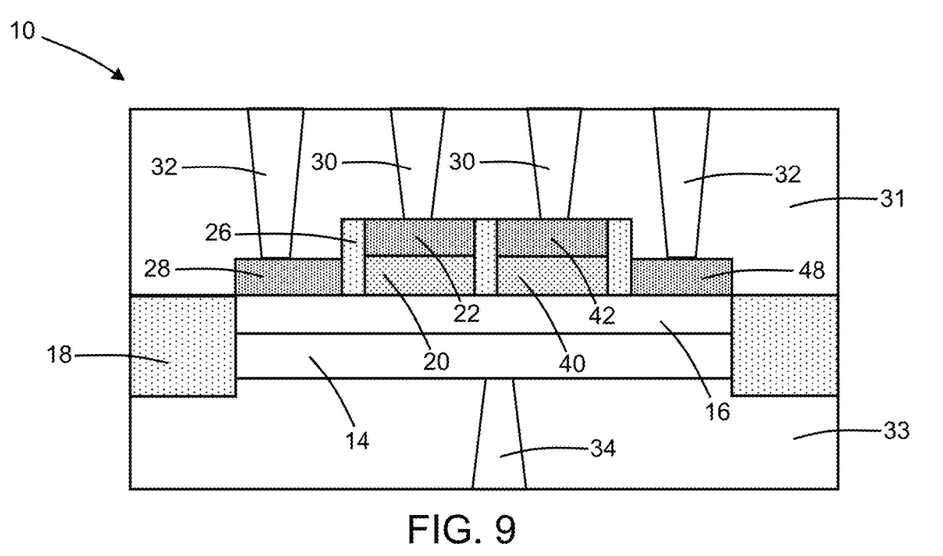
FIG. 9 is a cross-sectional view of a structure in accordance with alternative embodiments of the invention.

With reference to FIG. 9 and in accordance with alternative embodiments, a semiconductor layer 48 similar or identical to the semiconductor layer 28 may be formed on the semiconductor layer 16 to provide a symmetrical structural arrangement with multiple emitter fingers. The semiconductor layers 20, 22 and the semiconductor layers 40, 42 are disposed in a lateral direction between the semiconductor layer 28 and the semiconductor layer 48 with the semiconductor layer 28 adjacent to the semiconductor layers 20, 22 and the semiconductor layer 48 adjacent to the semiconductor layers 40, 42. One of the dielectric spacers 26 is positioned between the semiconductor layers 20, 22 and the semiconductor layer 28, one of the dielectric spacers 26 is positioned between the semiconductor layers 40, 42 and the semiconductor layer 48, and one of the dielectric spacers 26 is positioned between the semiconductor layers 20, 22 and the semiconductor layers 40, 42. In an embodiment, the semiconductor layer 48 may directly contact the top surface of the semiconductor layer 16. A contact 32 is formed in the dielectric layer 31 that is coupled to the semiconductor layer 48.

The semiconductor layer 48 may be formed on a portion of the semiconductor layer 16 after forming the dielectric spacers 26. The semiconductor layer 48, which may contain single-crystal semiconductor material, such as single-crystal silicon, may be formed as an epitaxial layer using an epitaxial growth process. In an embodiment, the epitaxial growth process may be selective in that the semiconductor material does not deposit on the dielectric material of the shallow trench isolation regions 18. The crystal structure of the single-crystal semiconductor material of the semiconductor layer 16 may serve as a crystalline template for the crystal structure of the single-crystal semiconductor material of the semiconductor layer 48 during epitaxial growth. In an embodiment, the semiconductor layer 48 may be doped with a concentration of a dopant, such as an n-type dopant (e.g., arsenic or phosphorus), to provide n-type conductivity. In an alternative embodiment, the semiconductor layer 48 may be doped with a concentration of a p-type dopant (e.g., boron) to provide n-type conductivity.

The semiconductor layer 48 overlaps with a portion of the semiconductor layer 16 adjacent to the portion of the semiconductor layer 16 overlapped by the stacked semiconductor layers 40, 42. In an embodiment, the semiconductor layer 48 may have a non-overlapping relationship with the adjacent shallow trench isolation region 18, and the semiconductor layer 28 may have a non-overlapping relationship with the adjacent shallow trench isolation region 18. In an alternative embodiment, the semiconductor layer 48 may overlap in part with the semiconductor layer 16 and in part with the adjacent shallow trench isolation region 18, and the semiconductor layer 28 may also overlap in part with the semiconductor layer 16 and in part with the adjacent shallow trench isolation region 18.

Figure 10:
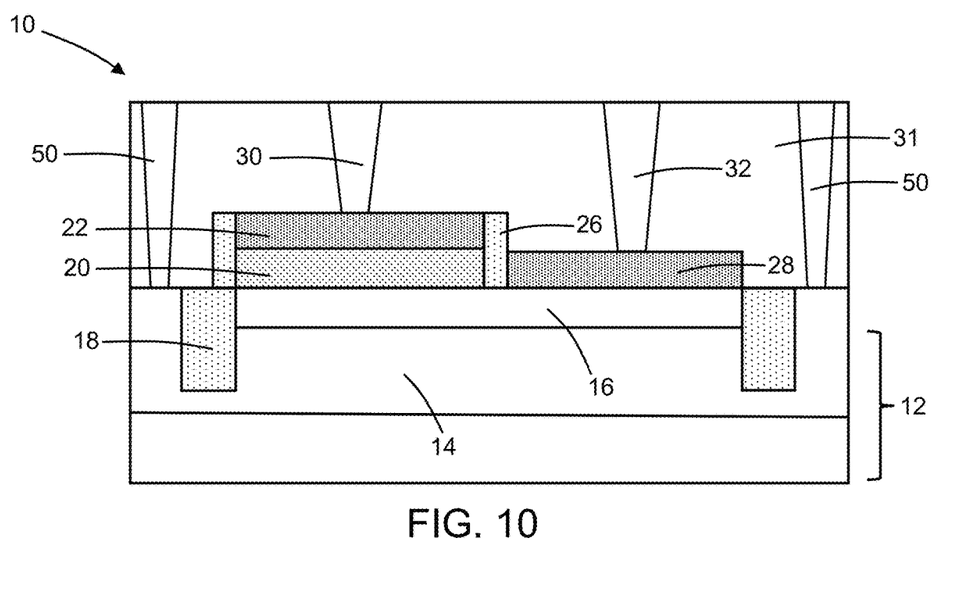
FIG. 10 is a cross-sectional view of a structure in accordance with alternative embodiments of the invention.

With reference to FIG. 10 and in accordance with alternative embodiments, frontside contacts 50 may be formed on the same side of the doped semiconductor region 14 as the semiconductor layers 20, 22 and the semiconductor layer 28, and the frontside contacts 50 may be physically and electrically coupled to the doped semiconductor region 14. Accordingly, the formation of the frontside contacts 50 may replace the thinning of the semiconductor substrate 12 and the formation of the backside contact 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:
    an intrinsic base including a first semiconductor layer, the first semiconductor layer including a first portion and a second portion adjacent to the first portion, and the first semiconductor layer comprising silicon-germanium;
    a collector including a second semiconductor layer, the second semiconductor layer including a first portion on the first portion of the first semiconductor layer;
    an emitter including a third semiconductor layer, the third semiconductor layer including a first portion on the second portion of the first semiconductor layer; and
    a first dielectric spacer laterally between the first portion of the second semiconductor layer and the first portion of the third semiconductor layer,
    wherein the first semiconductor layer has a top surface, the top surface is disposed between the first semiconductor layer and the second semiconductor layer, and the top surface is disposed between the first semiconductor layer and the third semiconductor layer.

2. The structure of claim 1, further comprising:
    an extrinsic base including a doped semiconductor region; and
    a plurality of shallow trench isolation regions that surround the doped semiconductor region.

3. The structure of claim 2, wherein the plurality of shallow trench isolation regions further surround the first semiconductor layer.

4. The structure of claim 3, wherein the plurality of shallow trench isolation regions are substantially coplanar with the top surface of the first semiconductor layer.

5. The structure of claim 3, wherein the second semiconductor layer includes a second portion on at least one of the plurality of shallow trench isolation regions, and the third semiconductor layer includes a second portion on at least one of the plurality of shallow trench isolation regions.

6. The structure of claim 2, wherein the first semiconductor layer is disposed between the doped semiconductor region and the second semiconductor layer.

7. The structure of claim 1, further comprising:
    an extrinsic base including a doped semiconductor region,
    wherein the first semiconductor layer is disposed between the doped semiconductor region and the second semiconductor layer.

8. The structure of claim 1, wherein the first semiconductor layer has a first conductivity type, and the second semiconductor layer and the third semiconductor layer have a second conductivity type that differs from the first conductivity type.

9. The structure of claim 1, further comprising:
    a first contact coupled to the first semiconductor layer;
    a second contact coupled to the second semiconductor layer; and
    a third contact coupled to the third semiconductor layer,
    wherein the top surface of the first semiconductor layer is vertically disposed between the first contact and the second contact, and the top surface of the first semiconductor layer is vertically disposed between the first contact and the third contact.

10. The structure of claim 1, wherein the collector includes a fourth semiconductor layer on the second semiconductor layer, the second semiconductor layer and the fourth semiconductor layer have the same conductivity type, and the fourth semiconductor layer has a higher dopant concentration than the second semiconductor layer.

11. The structure of claim 1, wherein the first semiconductor layer includes a third portion, the second portion is disposed between the first portion and the third portion, the collector includes a fourth semiconductor layer on the third portion, and further comprising:
    a second dielectric spacer laterally between the third semiconductor layer and the fourth semiconductor layer.

12. The structure of claim 1, wherein the third semiconductor layer includes a second portion that overlaps with the first dielectric spacer.

13. The structure of claim 12, wherein the third semiconductor layer includes a third portion that overlaps with the collector.

14. The structure of claim 1, further comprising:
    a first dielectric layer between the first portion of the second semiconductor layer and the first portion of the first semiconductor layer; and
    a second dielectric layer between the first portion of the third semiconductor layer and the second portion of the first semiconductor layer.

15. The structure of claim 1, wherein the first semiconductor layer includes a third portion, the first portion is disposed between the second portion and the third portion, the emitter includes a fourth semiconductor layer on the third portion, and further comprising:
    a second dielectric spacer laterally between the third semiconductor layer and the fourth semiconductor layer.

16. The structure of claim 1, further comprising:
    a plurality of shallow trench isolation regions that surround the first semiconductor layer,
    wherein the second semiconductor layer includes a second portion on at least one of the plurality of shallow trench isolation regions, and the third semiconductor layer includes a second portion on at least one of the plurality of shallow trench isolation regions.

17. The structure of claim 1 wherein the second semiconductor layer and the third semiconductor layer directly contact the top surface.

18. A structure for a heterojunction bipolar transistor, the structure comprising:
    an intrinsic base including a first semiconductor layer, the first semiconductor layer including a first portion and a second portion adjacent to the first portion, and the first semiconductor layer comprising silicon-germanium;
    a collector including a second semiconductor layer, the second semiconductor layer including a first portion on the first portion of the first semiconductor layer;
    an emitter including a third semiconductor layer, the third semiconductor layer including a first portion on the second portion of the first semiconductor layer; and a first dielectric spacer laterally between the first portion of the second semiconductor layer and the first portion of the third semiconductor layer, wherein the first semiconductor layer has a top surface, and the second semiconductor layer and the third semiconductor layer directly contact the top surface.

19. The structure of claim 18, further comprising:

a plurality of shallow trench isolation regions that surround the first semiconductor layer, wherein the second semiconductor layer includes a second portion on at least one of the plurality of shallow trench isolation regions, and the third semiconductor layer includes a second portion on at least one of the plurality of shallow trench isolation regions.

20. A method of forming structure for a heterojunction bipolar transistor, the method comprising:

forming an intrinsic base including a first semiconductor layer, wherein the first semiconductor layer includes a first portion and a second portion adjacent to the first portion, the first semiconductor layer has a top surface, and the first semiconductor layer comprises silicon-germanium;

forming a collector including a second semiconductor layer, wherein the second semiconductor layer includes a portion on the first portion of the first semiconductor layer, and the top surface is disposed between the first semiconductor layer and the second semiconductor layer;

forming a dielectric spacer; and forming an emitter including a third semiconductor layer, wherein the third semiconductor layer includes a portion on the second portion of the first semiconductor layer, the top surface is disposed between the first semiconductor layer and the third semiconductor layer, and the dielectric spacer is laterally between the portion of the second semiconductor layer and the portion of the third semiconductor layer.

* * * * *